(12) United States Patent
Dohn et al.

(10) Patent No.: US 10,327,323 B2
(45) Date of Patent: Jun. 18, 2019

(54) MULTI-LAYER COOLING ELEMENT

(71) Applicant: CeramTec GmbH, Plochingen (DE)

(72) Inventors: Alexander Dohn, Memmelsdorf (DE); Roland Dilsch, Thierstein (DE); Roland Leneis, Marktredwitz (DE)

(73) Assignee: CERAMTEC GMBH, Plochingen (DE)

( * ) Notice: Subject to any disclaimer, the term of this patent is extended or adjusted under 35 U.S.C. 154(b) by 0 days.

(21) Appl. No.: 15/509,601

(22) PCT Filed: Sep. 9, 2015

(86) PCT No.: PCT/EP2015/070618
§ 371 (c)(1),
(2) Date: Mar. 8, 2017

(87) PCT Pub. No.: WO2016/038094
PCT Pub. Date: Mar. 17, 2016

(65) Prior Publication Data
US 2017/0265294 A1   Sep. 14, 2017

(30) Foreign Application Priority Data

Sep. 9, 2014 (DE) .................. 10 2014 217 978

(51) Int. Cl.
*H05K 1/02* (2006.01)
*H01L 23/373* (2006.01)
(Continued)

(52) U.S. Cl.
CPC ....... *H05K 1/0203* (2013.01); *H01L 23/3731* (2013.01); *H01L 23/3735* (2013.01);
(Continued)

(58) Field of Classification Search
CPC ..................... H05K 1/0203; H05K 1/0306
(Continued)

(56) References Cited

U.S. PATENT DOCUMENTS 8,040,676 B2 * 10/2011 Kluge ................. F21V 29/004
257/712
2002/0025439 A1   2/2002   Ueda et al.
(Continued)

FOREIGN PATENT DOCUMENTS

DE   100 35 170 A1   2/2002
EP    1 320 286 A2   6/2003
(Continued)

OTHER PUBLICATIONS

International Search Report for PCT/EP2015/070618 dateed Dec. 7, 2015; English translation submitted herewith (7 Pages).

*Primary Examiner* — Mukundbhai G Patel
(74) *Attorney, Agent, or Firm* — Fitch, Even, Tabin & Flannery, L.L.P.

(57) ABSTRACT

To provide more space for additional circuit elements (coils, capacitors) and/or to allow the accommodation of additional circuit elements required for shielding the circuits, the metallization regions are arranged one over the other in at least two metallization layers. The carrier body has a surface on which sintered metallization regions are arranged in a first metallization layer, said metallization regions carrying electronic components and/or being structured such that the metallization regions form resistors or coils. The metallization regions are covered, together with the components and/or the resistors or coils, by a ceramic plate, and optionally additional metallization regions are arranged in additional metallization layers on the ceramic plate and each metallization region is covered by a ceramic plate. Sintered metallization regions are arranged in a metallization layer for the purpose of accommodating circuit elements on the uppermost ceramic plate facing away from the cooling elements.

16 Claims, 1 Drawing Sheet

(51) Int. Cl.
- *H01L 23/498* (2006.01)
- *H05K 1/03* (2006.01)
- *H05K 3/00* (2006.01)
- *H05K 1/09* (2006.01)
- *H05K 1/11* (2006.01)
- *H05K 1/16* (2006.01)
- *H05K 1/18* (2006.01)
- *H05K 3/12* (2006.01)
- *H05K 3/40* (2006.01)
- *H05K 3/46* (2006.01)

(52) U.S. Cl.
CPC ..... *H01L 23/49822* (2013.01); *H05K 1/0306* (2013.01); *H05K 1/09* (2013.01); *H05K 1/111* (2013.01); *H05K 1/115* (2013.01); *H05K 1/165* (2013.01); *H05K 1/167* (2013.01); *H05K 1/181* (2013.01); *H05K 3/0067* (2013.01); *H05K 3/1216* (2013.01); *H05K 3/4038* (2013.01); *H05K 3/4673* (2013.01); *H01L 2924/0002* (2013.01); *H05K 3/1291* (2013.01); *H05K 2201/066* (2013.01)

(58) Field of Classification Search
USPC .......................................................... 361/710
See application file for complete search history.

(56) References Cited

U.S. PATENT DOCUMENTS

| | | |
|---|---|---|
| 2002/0181185 A1 | 12/2002 | Kabumoto et al. |
| 2003/0218870 A1 | 11/2003 | Fisher et al. |
| 2007/0158101 A1* | 7/2007 | Chikagawa ............ H05K 1/186 174/260 |
| 2009/0199999 A1* | 8/2009 | Mitic .................. F28D 15/0241 165/104.26 |
| 2010/0112372 A1* | 5/2010 | Kluge .................. H05K 1/0254 428/600 |
| 2010/0156251 A1* | 6/2010 | Hohmann ........... H01L 41/0472 310/364 |

FOREIGN PATENT DOCUMENTS

| | | |
|---|---|---|
| JP | 2000-058381 A | 2/2000 |
| WO | 2007/107601 A2 | 9/2007 |

* cited by examiner

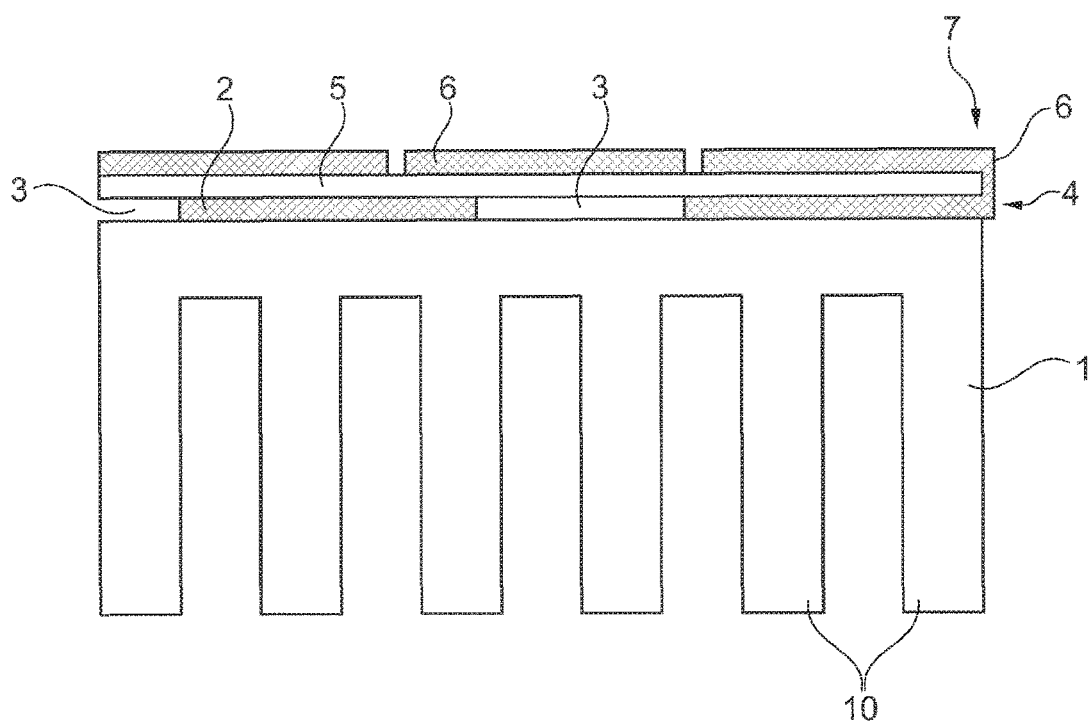

MULTI-LAYER COOLING ELEMENT

CROSS-REFERENCE TO RELATED APPLICATIONS

This application is a U.S. national phase application filed under 35 U.S.C. § 371 of International Application No. PCT/EP2015/070618, filed Sep. 9, 2015, designating the United States, which claims priority from German Patent Application No. 10 2014 217 978.5, filed Sep. 9, 2014, which are hereby incorporated herein by reference in their entireties for all purposes.

The invention relates to a ceramic carrier body having cooling elements and having sintered metallization regions.

Air- or liquid-cooled ceramic carrier bodies made of $Al_2O_3$ or AlN have a patterned metallization (Cu or Cu/Ni/Au, or W/Ni/Au), wherein the circuit components can be soldered directly thereon. As the result of an increasing degree of miniaturization or increasing switching frequency in power components, it may be necessary to have additional circuit elements, such as shielding, coils, or capacitors in the immediate vicinity of the components on the surface of the carrier. The increased switching frequencies used today generate high-frequency interference which must be elaborately shielded to avoid EMC problems.

The problem addressed by the invention is therefore that of advancing the design of a ceramic carrier body with cooling elements and with sintered metallization regions in such a manner that more space is available for other circuit elements (coils, capacitors) and/or it is possible to accommodate the additional circuit elements which are necessary to shield the circuits.

According to the invention, this problem is addressed by the carrier body described in claim 1.

The ceramic carrier body according to the invention is characterized by cooling elements and sintered metallization regions which are arranged in at least two metallization layers one above the other, wherein the carrier body has a surface on which are arranged, in a first metallization layer, the sintered metallization regions, which carry electronic components and/or are structured in such a manner that they form resistors or coils, and these metallization region are covered, together with the components and/or the resistors or coils, by a ceramic plate, wherein additional metallization regions of these sintered metallization regions are optionally arranged on the ceramic plate in additional metallization layers, each covered by a ceramic plate, wherein, on the uppermost ceramic plate, facing away from the cooling element, sintered metallization regions are arranged in a metallization layer to accommodate circuit elements.

So as to make it possible to accommodate additional circuit elements (coils, capacitors), or additional circuit elements which are necessary for shielding the circuits, in the limited space, according to the invention at least one additional metallization layer is therefore incorporated between the circuit layer and the cooling layer (fins or a layer with liquid cooling medium). This covered metallization can consist of the same material as the outer circuit layer, or of a different metal, preferably with a higher melting point. A contact between the metallic elements on the outside and the inside can be made by vias (punched, laser drilled) or by structures which are drawn out to the edge of the ceramic and connected externally. This inner layer can also be structured. It improves the disturbance reaction and can accommodate electronic components. Resistors and inductors can be realized by a suitable structuring and selection of a metal. This inner layer can, together with the cover layer, form capacitors which are determined by the geometry and spacing.

The cooling elements are either fins on the carrier body or cooling channels in the interior of the carrier body.

In a preferred implementation according to the invention, the additional metallization layer(s) carries/carry electronic components, and/or is/are structured such that it/they form(s) resistors or coils. The components in this case are incorporated into the metallization in such a manner that everything can be covered with a ceramic plate. When the metallization and/or the metallization layer is/are structured in such a manner that it/they form(s) resistors or coils, then the metallization forms a layer on which a ceramic plate can be easily placed.

The carrier body preferably is made of the ceramic materials aluminum oxide $Al_2O_3$ or aluminum nitride AlN. Both materials have good thermal conductivity and are not electrically conductive. The metallization regions can be easily sintered to these materials.

The uppermost metallization layer, used to accommodate the circuit elements, is preferably made of copper, and the inner metallization layers are preferably made of tungsten.

An inventive method for the production of a carrier body according to the invention is characterized in that, to produce a metallization layer after the ceramic carrier body with the cooling elements is produced,
a) sub-regions of the surface of the carrier body are coated with a tungsten/glass paste by screen printing, wherein at least at one point, the tungsten/glass paste is printed up to the outer edge of the carrier body,
b) next, the non-coated areas are printed with an insulating paste and the tungsten/glass paste and the insulating paste are subjected to binder removal,
c) next, a polished ceramic plate is placed on the debindered pastes,
d) and then optionally the method steps a, b, and c are repeated, in which case the ceramic plate is printed, and
e) finally, to create lateral metallizations by means of another screen printing step with copper paste on the lateral surface of the carrier body, the inner tungsten metallizations are connected to the uppermost copper metallization.

The individual method steps are generally known. Instead of or in addition to the lateral metallizations, vias can also be incorporated between the metallizations to create an electrical connection between the inner tungsten metallizations and the uppermost copper metallization.

BRIEF DESCRIPTION OF THE DRAWING

FIG. 1 illustrates an embodiment of a carrier body.

EXAMPLE

A polished cooling element 1 with fins 10 (see FIG. 1) made of AlN and having a size of 40×40×30 mm is coated 15 μm high, on the surface, with a tungsten/glass paste 2 in the form of a capacitor, by means of screen printing. By means of a complementary screen, the remaining area is printed with an insulating paste 3 (which contains a glass or the same ceramic of which the cooling element is made). The tungsten/glass paste 2 is printed at one point 4 up to the outer edge of the cooling element 1.

The tungsten-glass paste 2 and the insulating paste 3 are subjected to binder removal at 500° C. A polished ceramic plate 5 made of AlN and having dimensions of 40×40×2 mm is placed on the cooling element 1, and/or on the debindered tungsten/glass paste 2 and the insulating paste 3, and fired together with the printed cooling element 1 at 1300° C. in wet nitrogen-hydrogen. In this case, the two ceramic parts— i.e., the cooling element 1 with its fins 10 and the ceramic plate 5—connect to each other. The fired tungsten/glass paste 2 then forms an intermediate layer and/or a metallization of tungsten. The intermediate layer is also called a metallization region, and forms a metallization layer.

On the upper side of the plate 5 made of AlN, a motif or a metallization is printed with copper paste 6. The thickness of the copper paste 6 is preferably between 15 and 300 μm. The copper print and/or the copper paste 6 extends up to the outer edge 7 of the plate 5, and is connected to the tungsten intermediate layer on the lateral surface by means of a further screen printing step with copper paste 6.

The copper paste 6 and/or the copper metallization is fired in nitrogen at 910° C.

The invention therefore also describes a ceramic carrier body with cooling elements and with a circuit layer, consisting of sintered metallization regions for the purpose of accommodating circuit elements, wherein at least one additional metallization layer with sintered metallizations is arranged between the circuit layer and the carrier body, each of these additional metallizations being covered by a ceramic plate, wherein the metallizations of the circuit layer are sintered with the uppermost ceramic plate, which faces away from the cooling elements, and the sintered metallizations of the metallization layers are connected to the metallization of the circuit layer by vias, or electrically conductive structures which are drawn out to the edge of the ceramic and connected externally.

The invention claimed is:

1. A ceramic carrier body, having cooling elements and having sintered metallization regions which are arranged in at least two metallization layers one above the other, wherein the carrier body has a surface on which are arranged, in a first metallization layer, sintered metallization regions used for forming components, one or more insulating regions provided in the plane of the first metallization layer and in areas where the sintered metallization regions are not formed, and these metallization regions and insulating regions are covered by a ceramic plate, wherein additional metallization regions of these sintered metallization regions are optionally arranged on the ceramic plate in one or more additional metallization layers, each covered by means of a ceramic plate, wherein, on the uppermost ceramic plate, facing away from the cooling elements, sintered metallization regions are arranged in a metallization layer to accommodate circuit elements,
wherein the sintered metallization regions on the uppermost ceramic plate comprise copper, an inner metallization region of the sintered metallization regions comprises tungsten, and the carrier body further comprises an electrically conductive structure comprising copper drawn around an edge of the ceramic plate and connecting the sintered metallization regions on the uppermost ceramic plate and the inner metallization region.

2. The carrier body according to claim 1, wherein the cooling elements are fins on the carrier body or cooling channels in the interior of the carrier body.

3. The carrier body according to claim 1, wherein the one or more additional metallization layers are used for forming components.

4. The carrier body according to claim 1, wherein the carrier body is made of the ceramic materials aluminum oxide $Al_2O_3$ or aluminum nitride AlN.

5. The carrier body according to claim 1, wherein the uppermost metallization layer for accommodating the circuit elements is made of copper, and the other inner metallization layers are made of tungsten.

6. A method for the production of a carrier body according to claim 1, wherein, to produce a metallization layer after the ceramic carrier body with the cooling elements is produced,
   a) sub-regions of the surface of the carrier body are coated with a tungsten/glass paste by screen printing, wherein at least at one point, the tungsten/glass paste is printed up to the outer edge of the carrier body,
   b) next, the non-coated areas are printed with an insulating paste and the tungsten/glass paste and the insulating paste are subjected to binder removal,
   c) next, a polished ceramic plate is placed on the debindered pastes,
   d) and then optionally the method steps a, b, and c are repeated, in which case the ceramic plate is printed, and
   e) finally, to create lateral metallizations by means of another screen printing step with copper paste on the lateral surface of the carrier body, the inner tungsten metallizations are connected to the uppermost copper metallization.

7. The method according to claim 6, further comprising vias incorporated between the metallization layers for the purpose of electrical connection between the inner tungsten metallizations and the uppermost copper metallization.

8. The carrier body according to claim 1, further comprising a via connecting the metallization layer to accommodate circuit elements to at least one of the first metallization layer and the optional additional metallization layers.

9. A ceramic carrier body comprising:
   a cooling element;
   an inner sintered metallization layer formed on the cooling element, the inner sintered metallization layer being used for forming components;
   one or more insulating regions provided in the plane of the inner sintered metallization layer and in areas where the inner sintered metallization layer is not formed;
   an outer sintered metallization layer;
   a ceramic plate formed between the inner sintered metallization layer and the outer sintered metallization layer,
   wherein the outer sintered metallization layer comprises copper, the inner sintered metallization layer comprises tungsten, and the carrier body further comprises an electrically conductive structure comprising copper drawn around an edge of the ceramic plate and connecting the outer sintered metallization layer and the inner sintered metallization layer.

10. The carrier body of claim 9, further comprising a circuit element formed on the outer sintered metallization layer.

11. The carrier body of claim 9, wherein the cooling element comprises fins on the carrier body or cooling channels in the interior of the carrier body.

12. The carrier body of claim 9, further comprising one or more additional inner sintered metallization layers and one or more additional ceramic plates, the ceramic plates being disposed between the metallization layers.

13. The carrier body of claim 12, wherein at least one of the one or more additional inner sintered metallization layers is used for forming components.

14. The carrier body of claim 12, further comprising a via connecting the outer sintered metallization layer to at least one of the inner sintered metallization layers.

15. The carrier body of claim 9, wherein the carrier body comprises aluminum oxide or aluminum nitride.

16. The carrier body of claim 9, further comprising a via connecting the outer sintered metallization layer to the inner sintered metallization layer.

\* \* \* \* \*